United States Patent [19]
Keyser

[11] Patent Number: 6,133,693
[45] Date of Patent: Oct. 17, 2000

[54] INTERCONNECTS AND ELECTRODES FOR HIGH LUMINANCE EMISSIVE DISPLAYS

[75] Inventor: Thomas R. Keyser, Ellicott City, Md.

[73] Assignee: AlliedSignal Inc., Morristown, N.J.

[21] Appl. No.: 09/128,019

[22] Filed: Jul. 30, 1998

[51] Int. Cl.[7] .................. H01J 1/62; H01J 63/04
[52] U.S. Cl. .................. 313/506; 313/509; 313/113; 315/169.3; 349/106
[58] Field of Search .................. 313/503, 505, 313/506, 509, 113; 428/690, 917; 315/169.3; 349/106

[56] References Cited

U.S. PATENT DOCUMENTS

| | | | |
|---|---|---|---|
| 3,915,548 | 10/1975 | Opittck et al. | 350/3.5 |
| 5,528,397 | 6/1996 | Zavracky et al. | 315/169.3 |
| 5,640,067 | 6/1997 | Yamauchi et al. | 313/506 |
| 5,654,811 | 8/1997 | Spitzer et al. | 349/106 |
| 5,684,365 | 11/1997 | Tang et al. | 315/169.3 |
| 5,712,534 | 1/1998 | Lee et al. | 315/169.3 |
| 5,910,706 | 6/1999 | Stevens et al. | 313/113 |
| 5,912,533 | 6/1999 | Lee et al. | 313/509 |
| 5,920,080 | 7/1999 | Jones | 313/509 |
| 6,016,033 | 1/2000 | Jones et al. | 313/506 |
| 6,023,073 | 2/2000 | Strite | 313/506 |

*Primary Examiner*—Michael H. Day
*Assistant Examiner*—Mariceli Santiago
*Attorney, Agent, or Firm*—Loria B. Yeadon

[57] ABSTRACT

An electroluminescent device in accordance with the present invention includes a device layer including devices for activating a plurality of pixel electrodes. The pixel electrodes are used for stimulating light emission from an electroluminescent stack disposed thereon. The plurality of pixel electrodes have an upper surface facing in a first direction. An interconnection system is disposed between the device layer and the plurality of pixel electrodes for coupling the devices to the pixel electrodes. The upper surface of the pixel electrodes includes a reflective material for reflecting the light emissions from the electroluminescent layer in the first direction.

10 Claims, 4 Drawing Sheets

INTERCONNECTS AND ELECTRODES FOR HIGH LUMINANCE EMISSIVE DISPLAYS

RELATED APPLICATION DATA

This application is related to the commonly assigned application entitled "ELECTROLUMINESCENT DEVICES AND METHOD OF FORMING SAME", Ser. No. 09/126,288 filed concurrently herewith, and incorporated herein by reference.

GOVERNMENTAL INTEREST

The U.S. Government through the Advanced Research Projects Agency, Agreement No. MDA972-95-3-0029, has a paid-up license in this invention to practice or have practiced on behalf of the United States the subject invention throughout the world.

BACKGROUND OF THE INVENTION

1. Field of the Invention

The present invention relates to electroluminescent structures and, more particularly, to an electroluminescent structure having increased brightness and resolution for electroluminescent displays.

2. Description of the Related Art

Electroluminescent (EL) displays produce light when an alternating current (AC) voltage is applied across a phosphor film sandwiched between a pair of electrodes. Referring to FIG. 1, electroluminescent light originates from metal activator atoms that are introduced into a phosphor film 12 and excited by energetic electrons as they move across the semiconducting phosphor film 12. Since the phosphors employed have large band gaps, visible radiation produced (indicated by arrows) passes through film 12 without absorption and out of the stack through a transparent electrode 14.

The typical EL film stack contains two dielectric layers 16 and 18, one at each electrode interface, i.e. one for transparent electrode 14 and one for electrodes 20. These dielectric layers limit the current through the structure and prevent a catastrophic breakdown should a phosphor imperfection produce a conductive path through film 12. Dielectric layers 16 and 18 also store charge, increase the internal electric field and reduce the effective turn-on voltage of the phosphor. Thin 500 to 1000 Å films with high dielectric constants are often used to enhance the effect and increase the luminous efficiency of EL displays.

Compact high-resolution displays have been produced with on-chip scanning and pixel control circuitry. In these "active matrix" displays or active matrix electroluminescent (AMEL) displays, the necessary dielectric, phosphor and transparent electrode layers are deposited and defined as a single rectangle over the entire pixel array. Referring again to FIG. 1, individual pixel electrodes 20 are controlled by switching a transistor 22 which blocks the AC phosphor excitation voltage 24 when "off" and allows passage current through the phosphor when "on". Pixel electrodes 20 are positioned directly over the controlling transistors, to maximize resolution.

While this architecture addresses the information content and size requirements of small displays, the structure limits the brightness and resolution achievable. Pixel electrodes translate the underlying topology of the active matrix array and present an irregular surface that does not efficiently reflect phosphor radiation toward a viewer. Light emitted from one pixel can migrate from the electrode to neighboring pixels through lateral emission and internal reflection in the phosphor film stack to degrade resolution and color spectral purity as shown in FIG. 1. Pixel electrode structures that maximize the phosphor emission and transmission efficiency and minimize lateral light diffusion are needed to satisfy the requirements for high brightness, color and high resolution display products.

These and other factors contribute to difficulties associated with ambient light conditions. Implementation of emissive displays in high ambient light situations is currently restricted by the brightness level of the displays. Application of the displays in this type of environment requires significant improvements in existing materials and structures. Significantly brighter emissive displays, for example having a luminance of 1000 ft-Lamberts are needed to provide adequate display images to a viewer in high ambient light conditions with conventional optical systems.

Miniature active matrix displays are typically fabricated with integrated circuit processes on pilot or production lines using structures and materials that are in general use in the semiconductor industry. The circuits and devices employed resemble closely the elements that are used in conventional semi-conductor CMOS chips. Device interconnections are usually constructed from familiar polysilicon, silicide and aluminum films. These materials have become increasingly inadequate for the stringent requirements needed for active matrix displays.

In active matrix displays (or AMELs), for example, tungsten or aluminum metal alloys with refractory metal capping layers have been used for circuit interconnection and electrode fabrication. These materials provide the chemical and thermal stability necessary for compatibility with a subsequent phosphor deposition and activation steps (for an electroluminescent layer). Further the tungsten is used for its electrical conductivity, etchability and film coating conformality, all of which contribute to the reliability needed for high yield circuit interconnection.

Therefore, a need exists for highly reflective electrode structures in electroluminescent displays to maximize luminance and broaden useful applications of the displays. A further need exists for the high reflective electrode structures to retain their characteristics throughout the fabrication process and operational life.

SUMMARY OF THE INVENTION

An electroluminescent device in accordance with the present invention includes a device layer including devices for activating a plurality of pixel electrodes, the pixel electrodes stimulating light emission from an electroluminescent stack disposed thereon. The plurality of pixel electrodes have an upper surface facing a first direction toward the electroluminescent stack, and an interconnection system has a portion disposed between the device layer and the plurality of pixel electrodes for coupling the devices to the pixel electrodes. The upper surface of the pixel electrodes includes a reflective material for increasing an amount of reflected light emissions from the electroluminescent stack in the first direction.

In alternate embodiments of the electroluminescent device, the reflective material may have a reflectivity of greater than about 40 percent. The reflective material preferably includes chromium, iridium, rhodium, silver or aluminum. The interconnection system preferably includes metal lines and vias. The interconnection system may further include low reflectivity material for absorbing the light emitted from the electroluminescent layer thereby protecting the devices from the light. The interconnection system preferably includes tungsten or molybdenum. The interconnection system preferably includes a metal having a resistivity of less than or equal to about 60 $\mu\Omega$-cm.

Another electroluminescent display includes a substrate having a device layer formed thereon, the device layer including devices for activating a plurality of pixel electrodes, the plurality of pixel electrodes having an upper surface facing in a first direction toward an electroluminescent stack. The electroluminescent stack is formed on the pixel electrodes. An interconnection system has a portion disposed between the device layer and the plurality of pixel electrodes for coupling the devices of the device layer to the pixel electrodes. A transparent electrode is disposed on the electroluminescent stack such that the pixel electrodes and the transparent electrode are activated by the devices of the device layer thereby stimulating light emission from the electroluminescent stack. The upper surface of the pixel electrodes includes a reflective material for increasing reflected light emissions from the electroluminescent layer in the first direction for providing an improved display image to a viewer.

In alternate embodiments of the electroluminescent device, the reflective material may have a reflectivity of greater than about 40 percent. The reflective material preferably includes chromium, iridium, rhodium, silver or aluminum. The interconnection system preferably includes metal lines and vias. The interconnection system may further include low reflectivity material for absorbing the light emitted from the electroluminescent layer thereby protecting the devices from the light. The interconnection system preferably includes tungsten or molybdenum. The interconnection system preferably includes a metal having a resistivity of less than or equal to about 60 $\mu\Omega$-cm.

The electroluminescent stack may be electrically isolated by a first dielectric layer disposed between the plurality of pixel electrodes and an electroluminescent layer and a second dielectric layer disposed between the transparent electrode and the electroluminescent layer.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to electroluminescent structures and, more particularly, to an electroluminescent structure having increased brightness and resolution for electroluminescent displays. An electroluminescent structure in accordance with the present invention provides a pixel electrode array that includes a highly reflective surface that maximizes luminance of the display. The present invention further includes the use of refractory metals for metal layers (lines) and interconnects to the pixel electrodes. A metalization system for electroluminescent displays includes one or more levels of the refractory metal while the pixel electrodes are formed from a highly reflective material layer employed for emissive display fabrication. Greater detail of the structure of the present invention is described hereinbelow.

Figure 1:
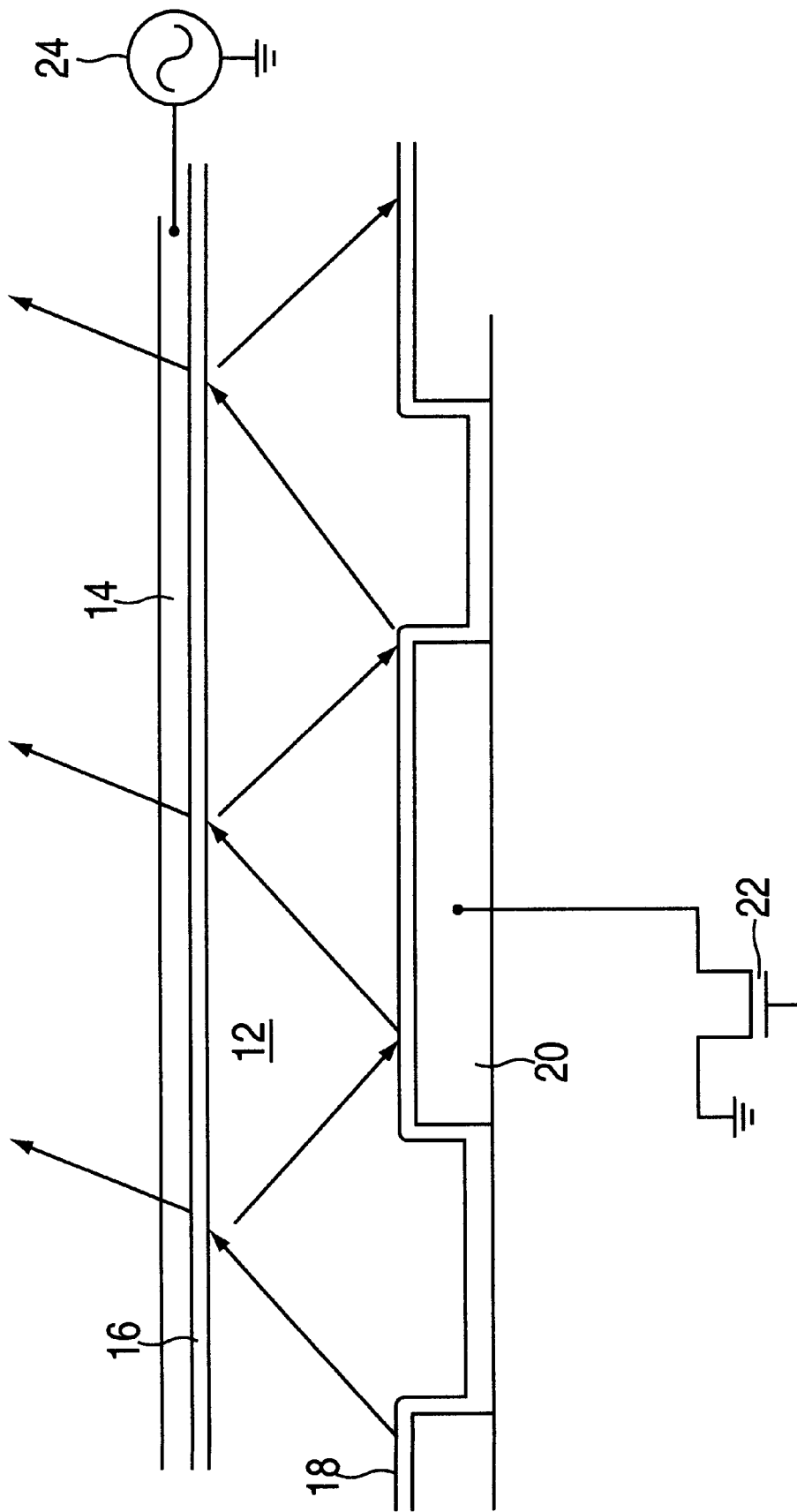
FIG. 1 is a cross-sectional view of a conventional electroluminescent device showing internal reflections.
Figure 2:
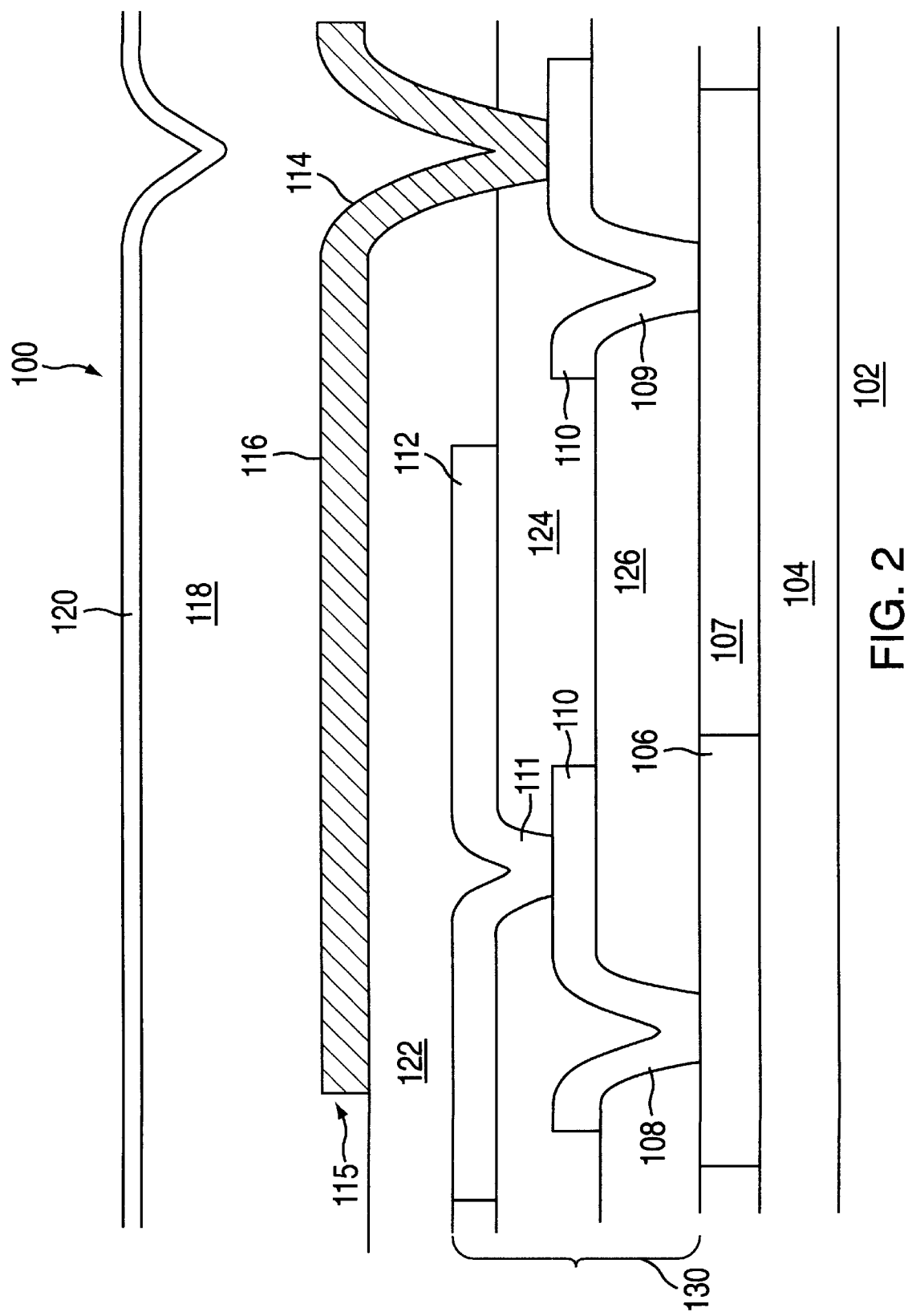
FIG. 2 is a cross-sectional view of a electroluminescent structure in accordance with the present invention showing a pixel electrode having highly reflective material.

Referring now in specific detail to the drawings and initially to FIG. 2, an electroluminescent (EL) structure is shown and referred to generally as structure 100. FIG. 2 shows one pixel electrode 116 and related structure. However, a plurality of structures 100 are disposed adjacent to each other to form a pixel array to be used in, for example an active matrix electroluminescent display (AMEL). A substrate 102 is provided for fabricating a high efficiency EL pixel electrode structure and control circuitry. Substrate 102 is preferably silicon although other suitable materials are contemplated. In a preferred embodiment, structure 100 uses silicon-on-insulator (SOI) architecture. An insulating layer 104 is formed on substrate 102 to isolate devices formed thereon from substrate 102. Insulating layer 104 is preferably formed from silicon dioxide or equivalent materials. A device layer 106 is formed on insulating layer 104. Device layer 106 is preferably silicon. Devices 107 are formed on device layer 106. Devices 107 include transistors, capacitors or other semiconductor devices. Transistors and capacitors comprise control circuitry for activating pixel electrode 116.

A dielectric layer 126 is formed on device layer 106. Vias 108 and 109 are formed in openings etched into dielectric layer 126. A conductive layer 110 is deposited in accordance with the present invention. Conductive layer 110 forms separate interconnect layers with vias 108 and 109 for electrically connecting different components for the control circuitry. Via 108 connects between, for example, a gate of a controlling transistor used to activate pixel electrode 116 and conductive layer 110. Via 109 connects between for example, a drain of the controlling transistor used to activate pixel electrode 116. A dielectric layer 124 is formed on conductive layer 110 and another conductive layer 112 is formed on dielectric layer 124. Conductive layer 112 is another interconnect layer. In one embodiment, conductive layer 112 can function as a capacitor plate and/or a high voltage shield to protect controlling transistors from phosphor (EL) excitation signals. Conductive layer 112 connects to control circuitry, for example, a transistor source, such as a blocking transistor to tie it to ground. A via 111 connects conductive layers 110 to 112 across dielectric layer 124.

An interlevel dielectric layer 122 is deposited to isolate the control circuitry from pixel electrode 116. Dielectric layer 122 is then planarized using established chemical-mechanical polishing (CMP) or by providing a sacrificial layer and etching it back to provide a planarized surface for the formation of additional layers as described hereinafter.

A hole for a via 114 is formed in dielectric layers 122 and 124 to provide for connection between pixel electrode 116 and devices 107. A conductive layer 115 is deposited and processed to form pixel electrode 116 and via 114 thereby connecting, for example a drain of a switching transistor in device layer 106 to electrode 116 by vias 109 and 114.

An electroluminescent stack 118 and a transparent electrode 120 are formed continuously across a surface of the structure 100. Electroluminescent stack 118 may include a dielectric layer above and below it to isolate electroluminescent layer 118 from pixel electrode 116 and transparent electrode 120, respectively. Electroluminescent stack 118 preferably includes zinc sulfide, strontium sulfide or organic materials. For organic materials, electroluminescent stack 118 does not include dielectric layers above and below it; instead an electron transport layer and a hole transport layer sandwich an organic electroluminescent layer.

In preferred embodiments, dielectric layers adjacent to electroluminescent stack 118 include aluminum oxide. Also, dielectric layers 122, 124 and 126 preferably include silicon dioxide. Other equivalent materials are contemplated.

Conductive layers 110 and 112 and vias 108, 109 and 111 include refractory metals or other conductive materials which are easily processed using conventional techniques and/or absorb electroluminescent light generated by electrode 116. Refractory metals are preferably used to create an interconnection system 130 between electrode 116 and device layer 106. A portion of interconnection system 130 may be present on the same level as the electrodes as well. Preferred refractory metals for interconnection system 130 include tungsten, molybdenum and alloys of each. These refractory metals provide stability for high temperature processing. The refractory metals may have resistivities of less than about 60 $\mu\Omega$-cm and include volatile chemical compounds that enable fabrication of efficient high density circuit interconnections using conventional semiconductor industry tools, for example, reactive ion etching (RIE). Low reflectance refractory metals are preferable as the low reflectance supports high resolution patterning with conventional photolithography techniques. Further, low reflectance refractory metals control light scattering within structure 100 and minimize current leakage by preventing emitted light from electrode 116 from reaching the device 107, for example, the switching transistors.

Highly reflective material is used to form electrode 116 and thereby substantially increase the brightness of pixel electrode 116 to a viewer. Highly reflective materials include highly reflective metals. Chromium, iridium, rhodium or alloys of each are preferable for materials of electrode 116. Chromium, iridium, rhodium are selected for electrodes 116 that are subjected to high temperature, oxidizing or sulfur-containing environments during the deposition of conductive layer 115 (emissive layer). Conventional devices provide a reflectivity of about less than 40%. Chromium, iridium and rhodium exhibit reflectivity of about 70% in the yellow-green color range that is about 2 fold greater than tungsten (which is currently used for electrodes in conventional devices). The present invention also contemplates reflectivities of about 40% or greater.

Aluminum, silver and alloys of each may be utilized for even greater reflectance when structure 100 is formed without exposure to the aggressive conditions described above.

These highly reflective materials can also be utilized to form interconnections on the same level conductive layer 115. This eliminates having to fabricate additional levels of metalization after conductive layer 115 is deposited thereby reducing circuit line resistance and providing wire bonding surfaces.

Figure 3:
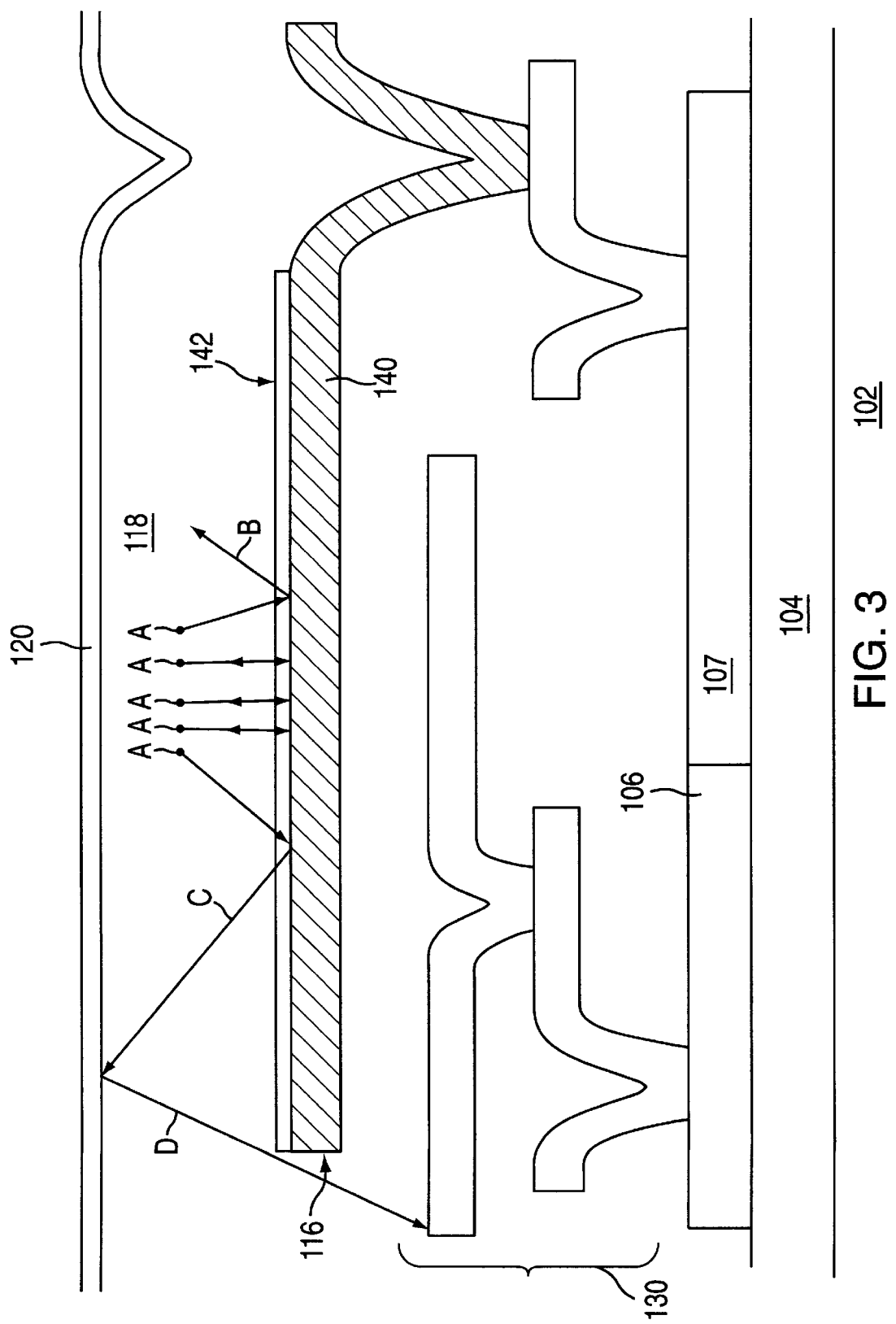
FIG. 3 is a cross-sectional view of a electroluminescent structure in accordance with the present invention showing a composite pixel electrode having an upper surface with highly reflective material and showing emitted light being reflected from the pixel electrode and absorbed by an interconnection system.

Referring to FIG. 3, alternately, electrode 116 may be formed by depositing a base metal 140 and then applying a layer of highly reflective material 142 thereon. The highly reflective material includes the materials described above. Light, indicated by arrows "A," is generated within EL stack 118 when electrode 116 is activated. The highly reflective material, i.e., chromium, iridium, etc., of electrode 116 reflects light back toward a viewer as indicated by arrows "B". Light reflected from surfaces above electrode 116, indicated by arrow "C," is absorbed by interconnect system 130 by low reflective materials, i.e., tungsten, molybdenum or their alloys as indicated by arrows "D". Electrode 116 is shown as a composite structure having highly reflective material of layer 142 on electrode 116. Portions of interconnection system 130 on the same level an electrodes 116 may be formed to absorb light to prevent reflections.

Figure 4:
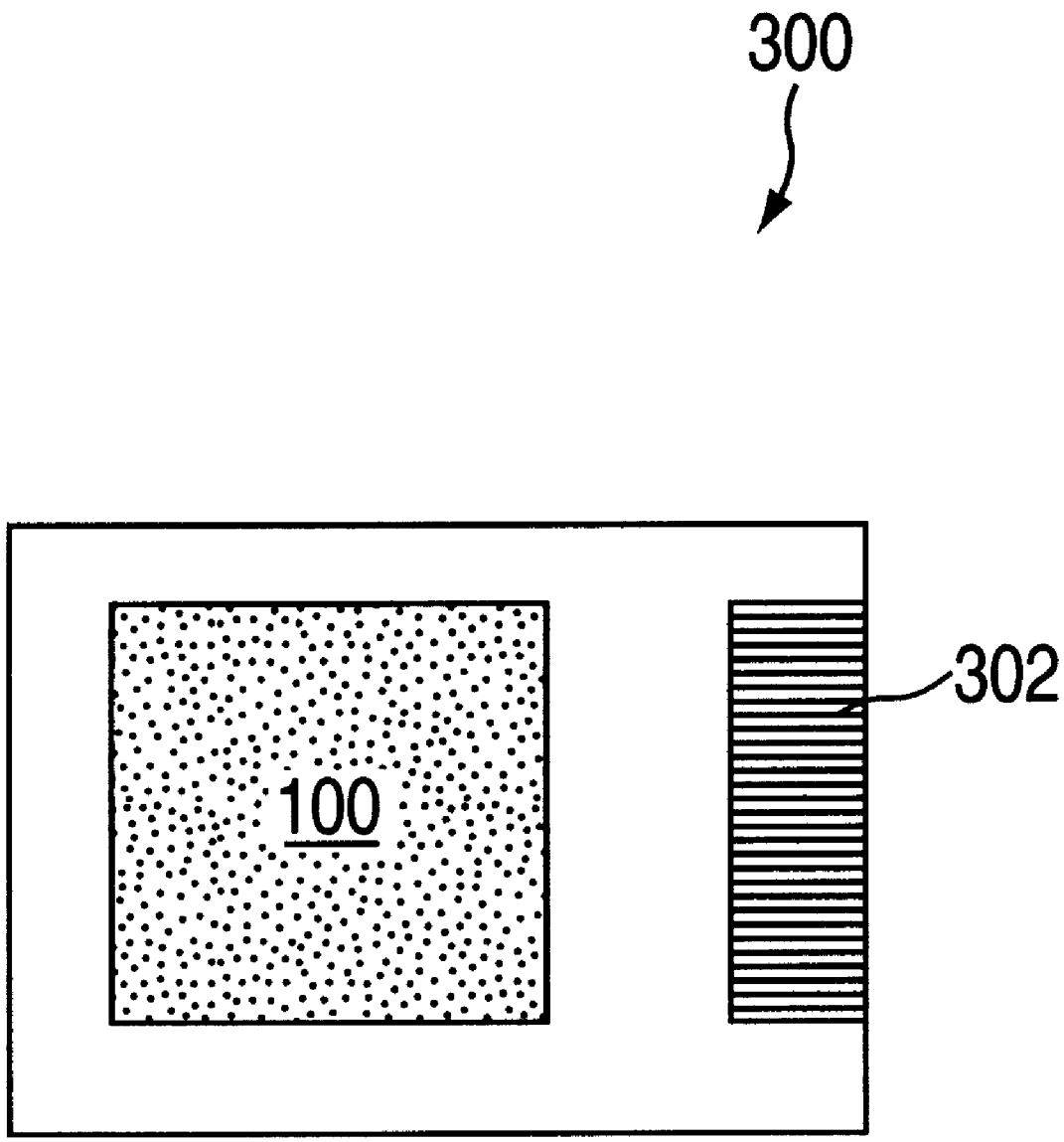
FIG. 4 is a top view of an electroluminescent display in accordance with the present invention.

Referring to FIG. 4, a display 300 is shown including structures 100 in accordance with the present invention. Display 300 includes a plurality of pixels each having a corresponding electrode as described above. Display 300 includes bonding pads for electrically connecting display 300 to a controller and a power source (both not shown) through connector interface 302. Bonding pads are normally located on the outer perimeter of structure 100 and connect to wires or metal lines which electrically couple structure 100 to interface 302. Display 300 receives data signals to be displayed from a controller, and is powered by a power source (not shown). Display 300 may be used as a wearable monitor in for example, a head mounted display.

Having described preferred embodiments of electroluminescent devices having improved performance (which are intended to be illustrative and not limiting), it is noted that modifications and variations can be made by persons skilled in the art in light of the above teachings. For example, the structure for the devices described herein may include organic materials for organic material EL stack devices. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An electroluminescent device comprising:
    a device layer including devices for activating a plurality of pixel electrodes for stimulating light emission from an electroluminescent stack disposed thereon;
    the plurality of pixel electrodes having an upper surface facing a first direction toward the electroluminescent stack;
    an interconnection system having a portion disposed between the device layer and the plurality of pixel electrodes for coupling the devices to the pixel electrodes; and
    the upper surface of the pixel electrodes including a reflective material including iridium for increasing an amount of reflected light emissions from the electroluminescent stack in the first direction.

2. An electroluminescent device comprising:
    a device layer including devices for activating a plurality of pixel electrodes for stimulating light emission from an electroluminescent stack disposed thereon;
    the plurality of pixel electrodes having an upper surface facing a first direction toward the electroluminescent stack;
    an interconnection system having a portion disposed between the device layer and the plurality of pixel electrodes for coupling the devices to the pixel electrodes; and
    the upper surface of the pixel electrodes including a reflective material including rhodium, for increasing an amount of reflected light emissions from the electroluminescent stack in the first direction.

3. An electroluminescent device comprising:

a device layer including devices for activating a plurality of pixel electrodes for stimulating light emission from an electroluminescent stack disposed thereon;

the plurality of pixel electrodes having an upper surface facing a first direction toward the electroluminescent stack;

an interconnection system having a portion disposed between the device layer and the plurality of pixel electrodes for coupling the devices to the pixel electrodes, the interconnection system including low reflectivity material for absorbing the light emitted from the electroluminescent stack thereby protecting the devices in the stack from the light; and the upper surface of the pixel electrodes including a reflective material for increasing an amount of reflected light emissions from the electroluminescent stack in the first direction.

4. An electroluminescent device comprising:

a device layer including devices for activating a plurality of pixel electrodes for stimulating light emission from an electroluminescent stack disposed thereon;

the plurality of pixel electrodes having an upper surface facing a first direction toward the electroluminescent stack;

an interconnection system having a portion disposed between the device layer and the plurality of pixel electrodes for coupling the devices to the pixel electrodes, the interconnection system including molybdenum; and the upper surface of the pixel electrodes including a reflective material, for increasing an amount of reflected light emissions from the electroluminescent stack in the first direction.

5. An electroluminescent device comprising:

a device layer including devices for activating a plurality of pixel electrodes for stimulating light emission from an electroluminescent stack disposed thereon;

the plurality of pixel electrodes having an upper surface facing a first direction toward the electroluminescent stack;

an interconnection system having a portion disposed between the device layer and the plurality of pixel electrodes for coupling the devices to the pixel electrodes, the interconnection system including a metal having a resistivity of less than or equal to about 60 $\mu\Omega$-cm; and the upper surface of the pixel electrodes including a reflective material, for increasing an amount of reflected the light emissions from the electroluminescent stack in the first direction.

6. An electroluminescent device comprising:

a substrate having a device layer formed thereon, the device layer including devices for activating a plurality of pixel electrodes, the plurality of pixel electrodes having an upper surface facing in a first direction toward an electroluminescent stack;

the electroluminescent stack formed on the pixel electrodes;

an interconnection system having a portion disposed between the device layer and the plurality of pixel electrodes for coupling the devices of the device layer to the pixel electrodes;

a transparent electrode disposed on the electroluminescent stack such that the pixel electrodes and the transparent electrode are activated by the devices of the device layer thereby stimulating light emission from the electroluminescent stack; and the upper surface of the pixel electrodes including a reflective material, the reflective material including iridium, for increasing reflected light emissions from the electroluminescent layer in the first direction for providing an improved display image to the viewer.

7. An electroluminescent device comprising:

a substrate having a device layer formed thereon the device layer including devices for activating a plurality of pixel electrodes, the plurality of pixel electrodes having an upper surface facing in a first direction toward an electroluminescent stack;

the electroluminescent stack formed on the pixel electrodes;

an interconnection system having a portion disposed between the device layer and the plurality of pixel electrodes for coupling the devices of the device layer to the pixel electrodes;

a transparent electrode disposed on the electroluminescent stack such that the pixel electrodes and the transparent electrode are activated by the devices of the device layer thereby stimulating light emission from the electroluminescent stack; and the upper surface of the pixel electrodes including a reflective material including rhodium for increasing reflected light emissions from the electroluminescent layer in the first direction for providing an improved display image to the viewer.

8. An electroluminescent device comprising:

a substrate having a device layer formed thereon the device layer including devices for activating a plurality of pixel electrodes, the plurality of pixel electrodes having an upper surface facing in a first direction toward an electroluminescent stack;

the electroluminescent stack formed on the pixel electrodes;

an interconnection system having a portion disposed between the device layer and the plurality of pixel electrodes for coupling the devices of the device layer to the pixel electrodes; and a transparent electrode disposed on the electroluminescent stack such that the pixel electrodes and the transparent electrode are activated by the devices of the device layer thereby stimulating light emission from the electroluminescent stack;

the upper surface of the pixel electrodes including a reflective material, for increasing reflected light emissions from the electroluminescent layer in the first direction for providing an improved display image to the viewer; and wherein the interconnection system includes low reflectivity material for absorbing the light emitted from the electroluminescent stack thereby protecting the devices in the stack from the light.

9. An electroluminescent device comprising:

a substrate having a device layer formed thereon, the device layer including devices for activating a plurality of pixel electrodes, the plurality of pixel electrodes having an upper surface facing in a first direction toward an electroluminescent stack;

the electroluminescent stack formed on the pixel electrodes;

an interconnection system having a portion disposed between the device layer and the plurality of pixel electrodes for coupling the devices of the device layer to the pixel electrodes, the interconnection system including molybdenum;

a transparent electrode disposed on the electroluminescent stack such that the pixel electrodes and the transparent electrode are activated by the devices of the device layer thereby stimulating light emission from the electroluminescent stack; and the upper surface of the pixel electrodes including a reflective material, for increasing reflected light emissions from the electroluminescent layer in the first direction for providing an improved display image to the viewer.

10. An electroluminescent device comprising:

a substrate having a device layer formed thereon, the device layer including devices for activating a plurality of pixel electrodes, the plurality of pixel electrodes having an upper surface facing in a first direction toward an electroluminescent stack;

the electroluminescent stack formed on the pixel electrodes;

an interconnection system having a portion disposed between the device layer and the plurality of pixel electrodes for coupling the devices of the device layer to the pixel electrodes, the interconnection system including a metal having a resistivity of less than or equal to about 60 $\mu\Omega$-cm, a transparent electrode disposed on the electroluminescent stack such that the pixel electrodes and the transparent electrode are activated by the devices of the device layer thereby stimulating light emission from the electroluminescent stack; and the upper surface of the pixel electrodes including a reflective material for increasing reflected light emissions from the electroluminescent layer in the first direction for providing an improved display image to the viewer.

* * * * *